(12) United States Patent
Kobayashi et al.

(10) Patent No.: US 8,514,155 B2
(45) Date of Patent: *Aug. 20, 2013

(54) DISPLAY UNIT, DRIVE CIRCUIT, AMORPHOUS SILICON THIN-FILM TRANSISTOR, AND METHOD OF DRIVING OLED

(75) Inventors: Yoshinao Kobayashi, Hiratsuka (JP); Takatoshi Tsujimura, Fujisawa (JP); Shinya Ono, Yokohama (JP)

(73) Assignee: International Business Machines Corporation, Armonk, NY (US)

( * ) Notice: Subject to any disclaimer, the term of this patent is extended or adjusted under 35 U.S.C. 154(b) by 1436 days.

This patent is subject to a terminal disclaimer.

(21) Appl. No.: 12/139,008

(22) Filed: Jun. 13, 2008

(65) Prior Publication Data

US 2009/0066682 A1    Mar. 12, 2009

Related U.S. Application Data

(60) Continuation of application No. 11/266,543, filed on Nov. 3, 2005, now abandoned, which is a division of application No. 10/373,475, filed on Feb. 25, 2003, now Pat. No. 7,102,202.

(30) Foreign Application Priority Data

Feb. 26, 2002  (JP) .................................. 2002-50171

(51) Int. Cl.
| | |
|---|---|
| *G09G 3/32* | (2006.01) |
| *G09G 3/14* | (2006.01) |
| *H01L 29/04* | (2006.01) |
| *H01L 29/10* | (2006.01) |
| *H01L 31/00* | (2006.01) |

(52) U.S. Cl.
USPC .................................. 345/82; 345/46; 257/40

(58) Field of Classification Search
USPC ............... 345/39, 44, 46, 48, 82, 83; 257/40, 257/52–72, 103, 401; 438/284, 286
See application file for complete search history.

(56) References Cited

U.S. PATENT DOCUMENTS

| | | |
|---|---|---|
| 4,680,484 A | 7/1987 | Saunders |
| 4,745,307 A | 5/1988 | Kitamura et al. |
| 5,117,127 A | 5/1992 | Gobbi et al. |

FOREIGN PATENT DOCUMENTS

| | | |
|---|---|---|
| JP | 2002-541320 | 5/2002 |
| WO | WO 01/06484 | 1/2001 |

OTHER PUBLICATIONS

English language Abstract of International Application No. WO 98/48403, dated Oct. 29, 1998.

*Primary Examiner* — Srilakshmi K Kumar
(74) *Attorney, Agent, or Firm* — Scully, Scott, Murphy & Presser, P.C.; Daniel P. Morris, Esq.

(57) ABSTRACT

A display unit has an organic light emitting diode (OLED) 21 provided in correspondence with each of pixels and capable of emitting light by itself, a drive transistor 22 for driving the OLED 21, a twig transistor 23 which is formed so as to have a portion of an electrode of the drive transistor 22 independently formed, and which is used to detect a threshold voltage (Vth) of the drive transistor 22, a compensating capacitor 28 in which the threshold voltage (Vth) detected by the twig transistor 23 is written, a signal capacitor 27 in which a signal voltage to be supplied to the drive transistor 22 is written, a first transistor 24 provided between a data line and the signal capacitor 27, a second transistor 25 provided between the signal capacitor 27 and the compensating capacitor 28, and a third transistor 26 provided between a gate electrode and another electrode of the twig transistor 23.

19 Claims, 9 Drawing Sheets

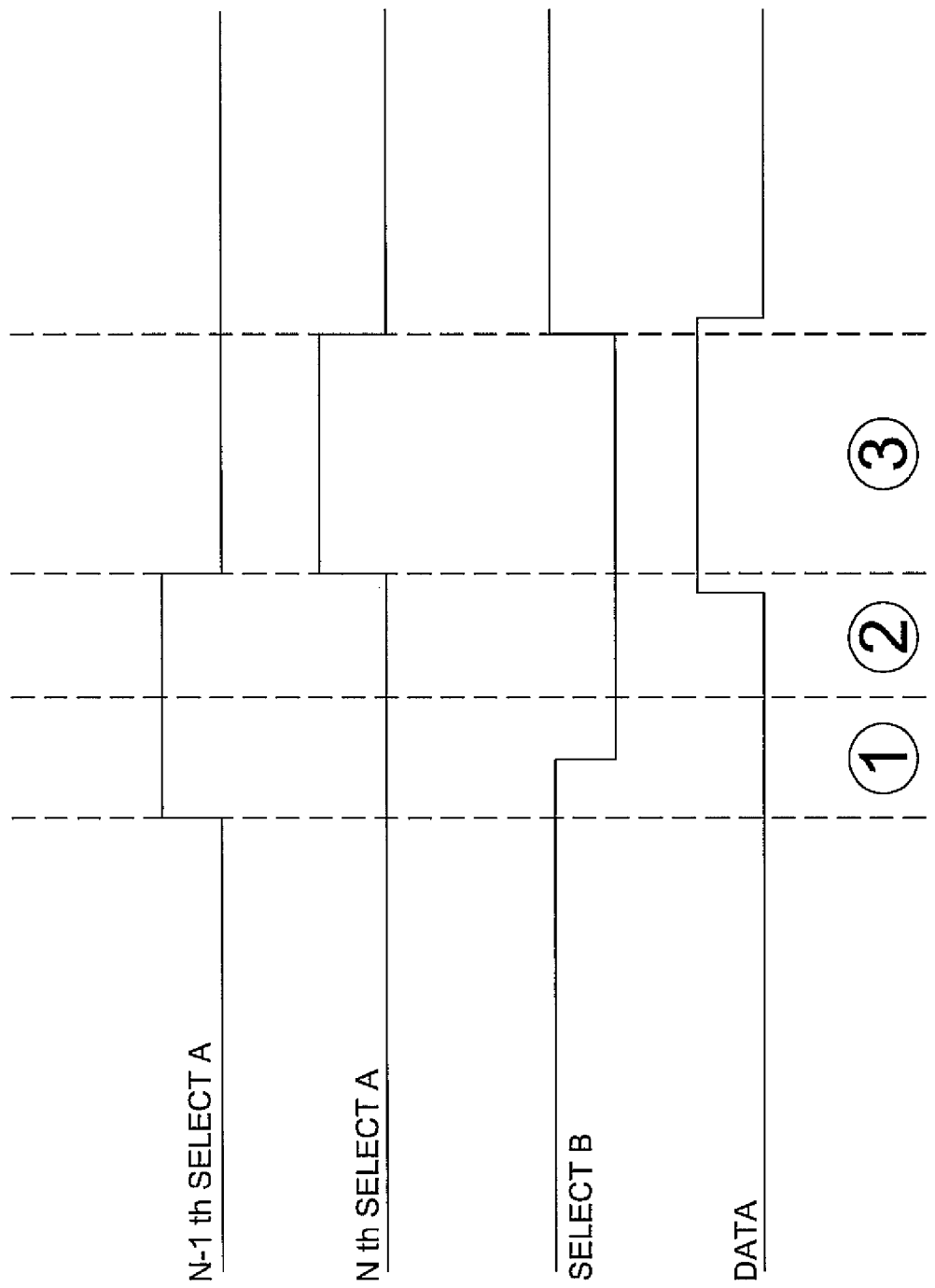

DISPLAY UNIT, DRIVE CIRCUIT, AMORPHOUS SILICON THIN-FILM TRANSISTOR, AND METHOD OF DRIVING OLED

CROSS REFERENCE TO RELATED APPLICATIONS

This application is a continuation of U.S. application Ser. No. 11/266,543 filed Nov. 3, 2005, which is a divisional of commonly owned U.S. Pat. No. 7,102,202 granted Sep. 5, 2006, the entire contents of which are incorporated herein by reference.

BACKGROUND OF THE INVENTION

1. Field of the Invention

The present invention relates to a display unit or the like using an organic light emitting diode (OLED). More particularly, the present invention relates to a display unit or the like in which compensation is made for variation in the threshold voltage (Vth) of a drive transistor.

2. Discussion of the Prior Art

An OLED (also referred to as "organic EL") is a device in which a dc voltage is applied to a fluorescent organic compound capable of being excited in an electric field to cause the compound to emit light, and which attracts attention as a next-generation display device. This OLED is a current-driven device, and a reduction in image quality results directly from variations in drive transistors for driving the OLEDs or variations in current due to degradation. In improving the image quality, it is effective to use a method of stabilizing the current output from each drive transistor by making compensation for variation in the threshold voltage (Vth), i.e., the point at which a current starts flowing through the drive transistor. OLED drive systems are broadly divided into voltage-write systems and current-write systems. Circuits for Vth compensation in each kind of drive system have been proposed.

FIGS. 8A and 8B are diagrams for explaining a method of realizing Vth compensation in a conventional voltage-write system. FIG. 8A is a circuit diagram and FIG. 8B is a timing chart. Referring to the circuit diagram of FIG. 8A relating to a voltage-write system using transistors, four FETs 201 to 204 and two capacitors 205 and 206 are used to drive an OLED 200. The FET 201 is a switch provided between a data line and the capacitor 205. The FET 202 is a transistor for driving the OLED 200. The FET 203 is a switch provided between the drain and the gate of the FET 202. The FET 204 is a switch provided between the FET 202 and the OLED 200. The capacitor 205 stores a data voltage, while the capacitor 206 stores Vth. When the FET 203 is turned on, the drain voltage and the gate voltage of the FET 202 are equal to each other. At this time, if a voltage is applied to the drain of the FET 202, the FET 202 is fully on. If no voltage is applied to the drain of the FET 202, charge on the FET 202 escapes through the drain to finally turn off the FET 203. At this time, Vth remains at the gate of the FET 203.

The operation of this circuit will be described with respect to periods with reference to FIG. 8B.

First, in a period (1), signal "Select" falls to turn on the FET 201, and AZ also falls to turn on the FET 203. In the preceding period, AZB is on and, therefore, the OLED 200 is in such a state that a current flows therethrough and the drain potential Vd of the FET 202 is sufficiently high relative to the ground potential of the OLED 200. That is, the potential Vd is sufficiently low. Thus, the gate-source voltage Vgs of the FET 202 has been shifted sufficiently largely in the minus direction, so that the FET 202 is maintained in the on state. In this state, the potential of the OLED 200 is about Vth. In this period, Vth compensation in the OLED 200 is made.

Next, in a period (2), after AZ has fallen to turn on the FET 203, AZB rises to turn off the FET 204. A current from Vdd flows round to the gate of the FET 202 to heighten the potential Vgs until Vgs=Vth. When Vgs=Vth, the FET 202 is turned off. When AZ rises to turn off the FET 203, Vth is programmed in C1 and C2.

In a period (3), when a signal of a level lower by ΔVdata than Vdd is input to a Data line, the voltages stored in the capacitors 205 and 206 are changed by capacitive division.

$$V_{C2} = Vdd - Vth \quad \text{(Equation 1)}$$

$$\cdot V_{C2} = Vdd - Vth - \frac{C1}{C1 + C2 + Cg} \cdot \Delta Vdata$$

In a period (4), AZB becomes on and the OLED 200 emits light. The current Ids flowing between the drain and source of the FET 202 is as shown by the following equation, which can be formed without the term Vth.

$$Ids = \alpha(Vgs - Vth)^2 = \alpha(\beta\Delta data - Vdd)^2 \quad \text{(Equation 2)}$$

In this equation, $$\beta = \frac{C1}{C1 + C2 + Cg} \quad \text{(Equation 3)}$$

FIGS. 9A and 9B are diagrams for explaining Vth compensation realized in a conventional current-write system. FIG. 9A is a circuit diagram and FIG. 9B is a timing chart. Referring to the circuit diagram of FIG. 9A relating to a current-write system using transistors, four FETs 211 to 214 and a capacitor 215 are used to drive an OLED 200. The FET 211 is a switch provided between a data line and the capacitor 215. The FET 212 is a transistor for driving the OLED 200. The FET 213 is a switch provided between the FET 212 and the OLED 200. The FET 214 is a switch provided between the drain and the gate of the FET 213. The capacitor 215 stores Vth.

The operation of this circuit will be described with respect to periods with reference to FIG. 9(b).

First, in a period (1), the FET 212 is turned off to shut off Vdd, thereby turning on the FETs 211 and 214. At this time, Idata flows through the FET 213. In a period (2), a voltage according to Idata is programmed in the capacitor 215. In a period (3), the FETs 211 and 214 are turned off and the FET 212 is turned on, thereby supplying Vdd to the FET 213 and to the OLED 200. At this time, current Idata is supplied to the OLED 200 according to the voltage stored in the capacitor 215.

Vth compensation has been made by the above-described systems. The above-described systems, however, require provision of two transistors connected in series (FETs 202 and 204 in the voltage-write system, and FETs 212 and 213 in the current-write system) between the power source Vdd and the OLED 200. That is, in order to detect Vth, it is necessary to connect two transistors in series and to use one of them for on/off control and the other for current control.

However, if the OLED 200 is driven by using all amorphous silicon (a-Si) thin-film transistor (TFT) for example, and if there is a need to cause a sufficiently large current to flow through the OLED 200, it is necessary that the TFT be large because the mobility in the amorphous silicon TFT is low and the current caused to flow therethrough is limited. If each of the above-described systems is realized by using amorphous silicon TFTs, the area occupied by the transistors is considerably large. On the other hand, there is a limit to the pixel size in displays. For this reason of mounting, it is difficult to use the above-described circuit requiring a certain number of large TFTs for forming a pixel.

SUMMARY OF THE INVENTION

The present invention solves the above-described technical problem, and an object of the present invention is to suitably extract the threshold voltage (Vth) from an amorphous silicon TFT.

Another object of the present invention is to make compensation for variation in Vth while the number of transistors having large capacitance is reduced.

Still another object of the present invention is to achieve simplified control by simultaneously performing detection of Vth and writing of data.

The present invention is characterized in that a threshold voltage (Vth) of an amorphous silicon TFT which is a transistor for driving an organic light emitting diode (OLED) is extracted through a twig transistor formed by a twig electrode formed as a branch from a portion of an electrode of the amorphous silicon TFT, a compensation is made for variation in the threshold voltage (Vth) to prepare a control voltage which is supplied to the drive transistor. That is, a display unit to which the present invention is applied has an OLED provided in correspondence with each of pixels and capable of emitting light by itself, a drive transistor for driving this OLED, and a twig transistor which is formed so as to have a portion of an electrode of this drive transistor independently formed, and which is used to detect the threshold voltage (Vth) of the drive transistor.

Further, the present invention may be characterized by including a capacitor for storing the threshold voltage (Vth) obtained by the twig transistor, and characterized in that a control voltage prepared by correcting a supplied signal voltage on the basis of the threshold voltage (Vth) stored in the capacitor is supplied to the drive transistor. Further, the present invention may also be characterized by including a hold circuit for supplying the signal voltage to the OLED, and a scanning circuit for supplying a select signal for scanning to the OLED, and characterized in that timing of taking in of the threshold voltage (Vth) and write to the drive transistor is controlled on the basis of the select signal supplied from the scanning circuit.

A display unit to which the present invention is applied includes drive means for driving, by using an amorphous silicon TFT, an organic light emitting diode (OLED) provided in correspondence with each of pixels and capable of emitting light by itself, threshold voltage acquisition means for obtaining a threshold voltage (Vth) in the amorphous silicon TFT by using a twig electrode formed in the amorphous silicon TFT used by the drive means, and signal voltage supply means for supplying a control voltage to the amorphous silicon TFT on the basis of the threshold voltage (Vth) obtained by the threshold voltage acquisition means.

The threshold voltage acquisition means obtains, by using the twig electrode, a gate voltage when the current flowing through the amorphous silicon TFT is sufficiently reduced from the state where the current is caused to flow through the amorphous silicon TFT. That is, an operation for reducing the current is executed by using the twig electrode. Also, it is advantageous to arrange the signal voltage supply means to prepare the control voltage by adding a newly obtained signal voltage and the threshold voltage (Vth) together, because compensation can be thereby made for variation in Vth of the amorphous silicon TFT.

On the other hand, a drive circuit to which the present invention is applied is characterized by including a drive transistor for driving a device to be driven such as an OLED or the like, which transistor is typified by an amorphous silicon TFT, a twig transistor which is formed so as to have a portion of an electrode of the drive transistor independently formed, and which is used to detect a threshold voltage (Vth) of the drive transistor when a current flows through the drive transistor, a compensating capacitor in which the threshold voltage (Vth) detected by the twig transistor is written, a signal capacitor in which a signal voltage necessary for control of the drive transistor is written, a first transistor provided between a data line and the signal capacitor, a second transistor provided between the signal capacitor and the compensating capacitor, and a third transistor provided between a gate electrode and another electrode of the twig transistor.

An amorphous silicon thin-film transistor to which the present invention is applied is characterized by including a gate electrode, amorphous silicon, a source electrode and a drain electrode which face the gate electrode with the amorphous silicon interposed therebetween, and a twig electrode formed by separating a portion of one of the source electrode and the drain electrode, and characterized in that the twig electrode is placed in such a position that a voltage closer to the corresponding voltage on the electrode before separation can be easily obtained, that the twig electrode is placed close to the electrode before separation, and that the twig electrode is an electrode forming a twig transistor for detecting a threshold voltage (Vth) of a transistor formed by the electrode before separation.

In another aspect of the present invention, an amorphous silicon thin-film transistor to which the present invention is applied is characterized by including a gate electrode, amorphous silicon, a source electrode and a drain electrode which face the gate electrode with the amorphous silicon interposed therebetween, and a twig electrode formed as a branch from the drain electrode and forming a twig transistor for detecting a threshold voltage (Vth) of a transistor formed by the gate electrode, the source electrode and the drain electrode.

A method of driving an organic light emitting diode (OLED) by an amorphous silicon TFT in accordance with the present invention includes a step of writing a signal voltage to the amorphous silicon TFT, a step of reading a threshold voltage (Vth) of the amorphous silicon TFT by using a twig transistor provided on the amorphous silicon TFT, and a step of supplying a control voltage to the amorphous silicon TFT by correcting a new signal voltage on the basis of the threshold voltage (Vth). Specifically, the step of supplying the control voltage comprises adding the new signal voltage and the threshold voltage (Vth) together. Also, the step of reading the threshold voltage (Vth) comprises executing reading on the basis of an (N−1)th select signal precedent to an Nth select signal for supplying the control voltage.

BRIEF DESCRIPTION OF THE DRAWINGS

FIG. 5 is a timing chart of drive of the drive circuit shown in FIG. 4;

DETAILED DESCRIPTION OF THE INVENTION

The present invention will be described in detail with respect to an embodiment thereof with reference to the accompanying drawings.

| Description of symbols | |
|---|---|
| 10 | OLED display |
| 11 | Control circuit |
| 12 | Scanning circuit |
| 13 | Hold circuit |
| 20 | Drive circuit |
| 21 | Organic light emitting diode (OLED) |
| 22 | Drive transistor |
| 23 | Twig transistor |
| 24 | First transistor |
| 25 | Second transistor |
| 26 | Third transistor |
| 27 | Signal capacitor |
| 28 | Compensating capacitor |
| 31 | OLED |
| 32 | Drive transistor |
| 33 | Twig transistor |
| 34 | First transistor |
| 35 | Second transistor |
| 36 | Third transistor |
| 37 | Fourth transistor |
| 38 | Signal capacitor |
| 39 | Compensating capacitor |
| 51 | Gate electrode |
| 52 | Source electrode |
| 53 | Drain electrode |
| 54 | Twig electrode |
| 55 | Glass substrate |
| 56 | Insulating film |
| 57 | Amorphous silicon (a-Si) |

Figure 1:
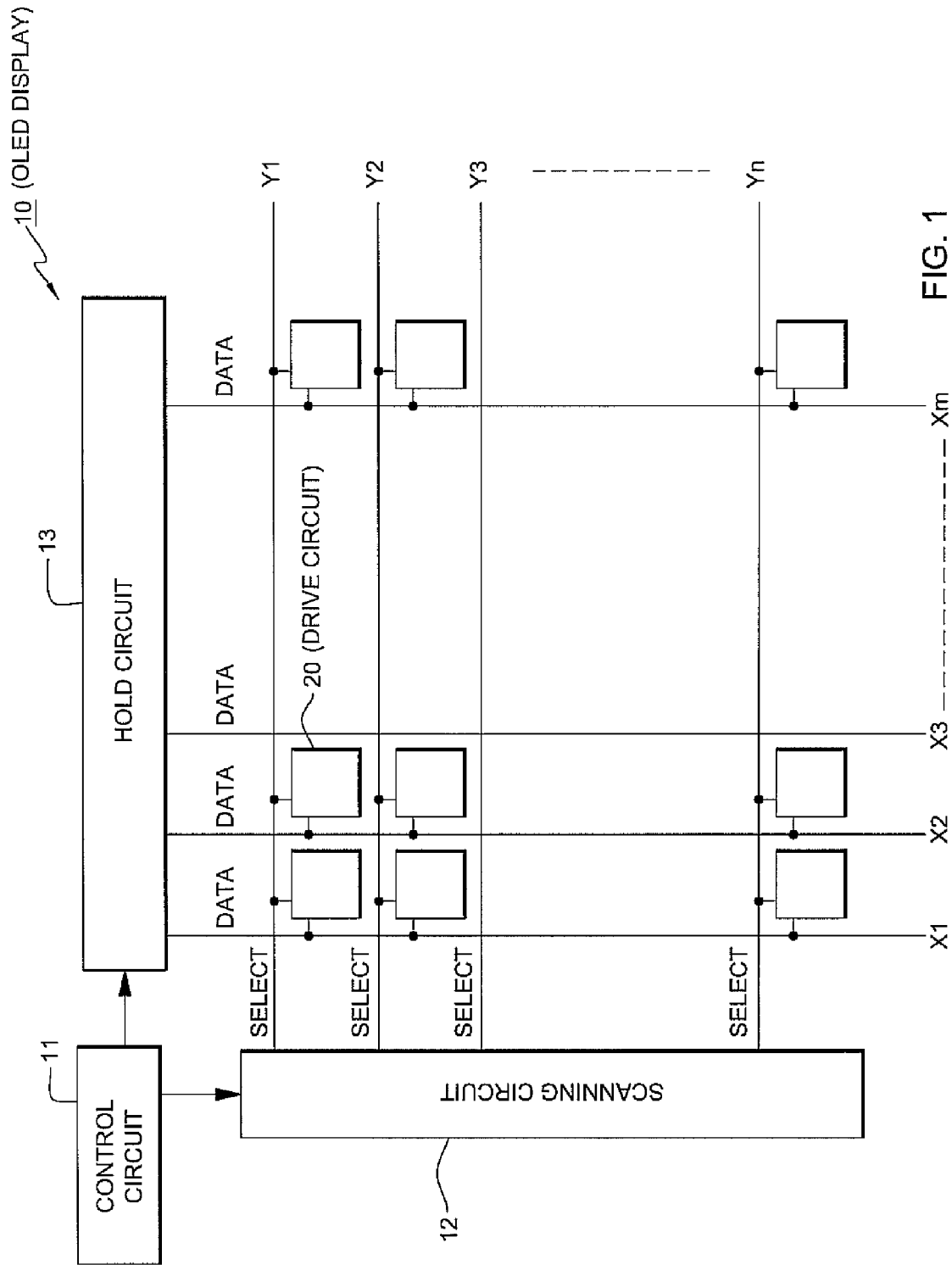
FIG. 1 is a diagram showing an active-matrix OLED display to which an embodiment of the present invention is applied.

FIG. 1 is a diagram showing an active-matrix OLED display 10 to which this embodiment of the present invention is applied. Among passive and active drive systems known as OLED drive systems, an active drive system is suitable for control of 260,000 full colors or more, for example. The active drive system requires TFT drive. TFT technology includes a method using amorphous silicon (a-Si) and a method using low-temperature polysilicon. In this embodiment, an active-matrix OLED display 10 using an amorphous silicon TFT is formed in accordance with the present invention. This OLED display 10 has, for drive of an m'n array dot-matrix display panel, a control circuit 11 which processes a supplied video signal to output control signals to driver circuits while timing the outputs as required, a scanning circuit 12 which supplies select signals (address signals) to scanning lines Y1 to Yn on the basis of the control signal from the control circuit 11, a hold circuit 13 which supplies data signals to data lines X1 to Xm on the basis of the control signal from the control circuit 11, and drive circuits 20 which are provided in correspondence with m'n pixels, and which are controlled through the select signal from the scanning circuit 12 and the data signal from the hold circuit 13. The OLED display 10 may be grasped as a display unit which includes a circuit for generating the video signal supplied to the control circuit 11.

Figure 2:
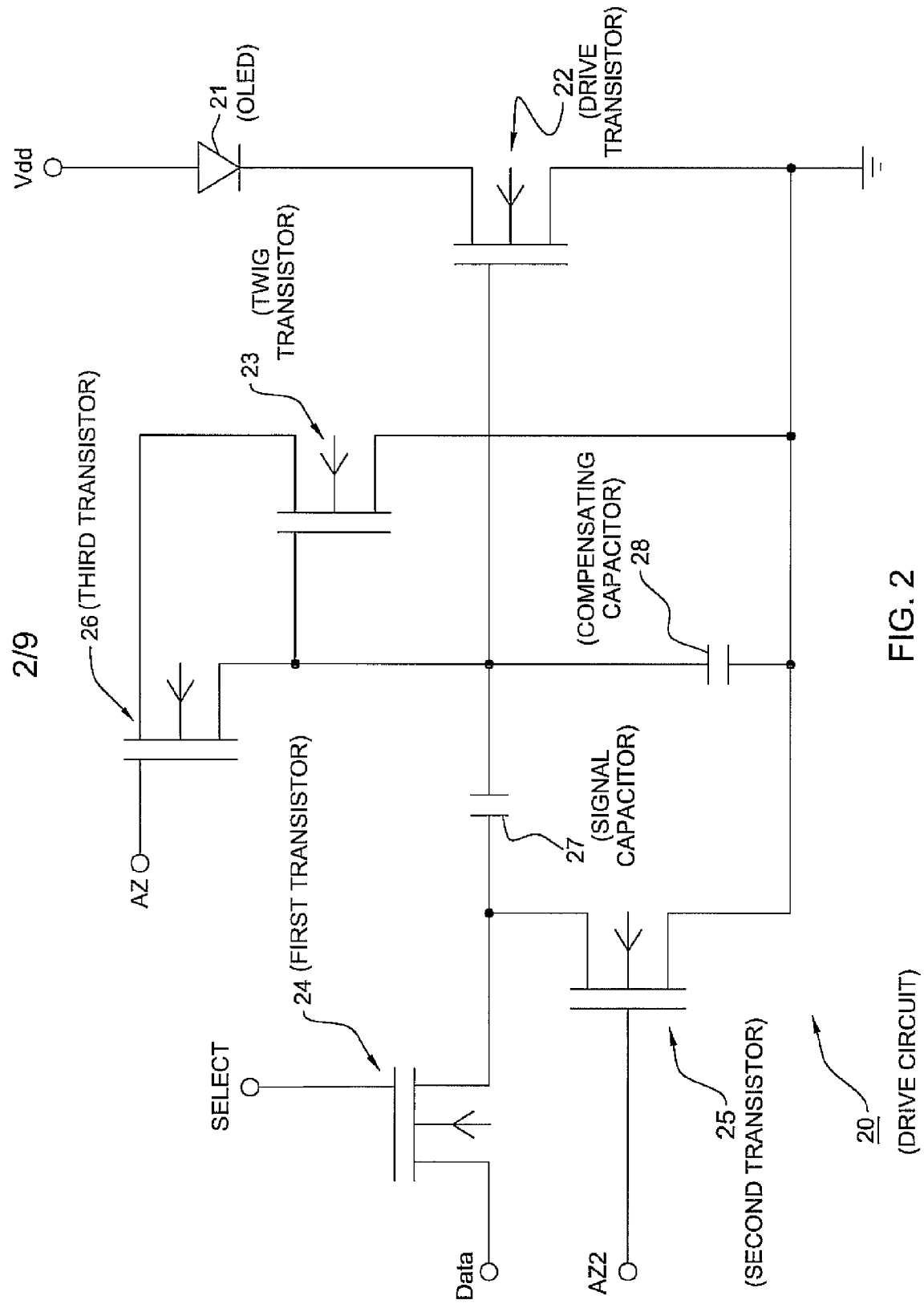
FIG. 2 is a diagram showing a configuration of a drive circuit used in the OLED display.
Figure 3:
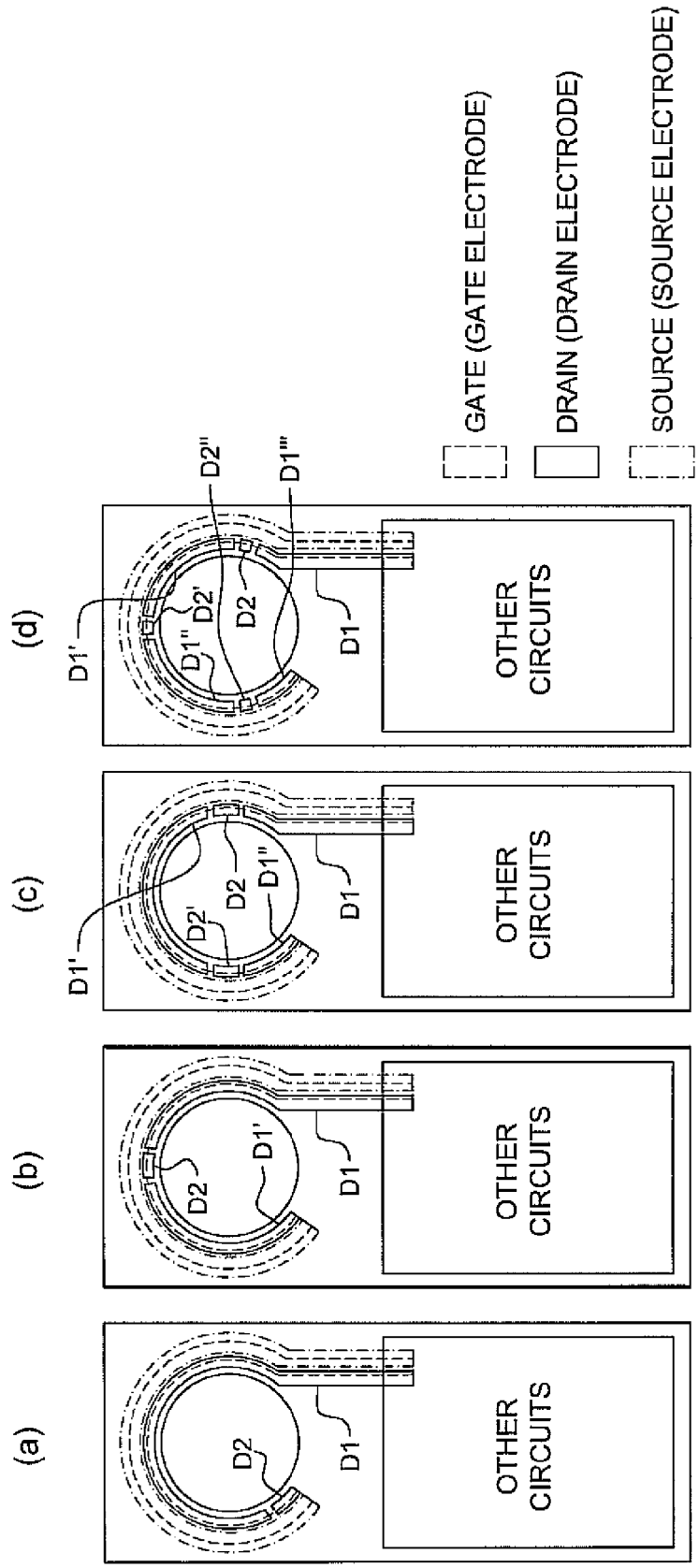
FIGS. 3A to 3D are diagrams showing J-hook transistors in several patterns.

FIG. 2 is a diagram showing a configuration of the drive circuit 20 used in the OLED display 10. The drive circuit 20 shown in FIG. 2 is constituted by an organic light emitting diode (OLED) 21 using an organic compound in a light emitting layer, five transistors (22 to 26), and two capacitors (27, 28). The transistors in the drive circuit 20 are a drive transistor 22 formed of an amorphous silicon (a-Si) TFT provided as a large transistor for driving the OLED 21, a twig transistor 23 which has a source electrode, a gate electrode, etc. in common with the drive transistor 22, and which has only a drain electrode as its independent portion, a first transistor 24 provided between a data line and a signal capacitor 27, a second transistor 25 provided between the data line side of the signal capacitor 27 and ground (GND), and a third transistor 26 provided between the gate and the drain of the twig transistor 23. The capacitors in the drive circuit 20 are the signal capacitor 27 in which a control voltage necessary for control of the drive transistor 22 is written, and a compensating capacitor 28 which has a capacitance about twice that of the signal capacitor 27, and in which a threshold voltage (Vth), i.e., a point at which a current starts flowing through the drive transistor 22 is stored.

In field-effect transistors (FETs) in general, the relationship between gate-source voltage $V_{GS}$ and drain current ID is expressed by a second-power curve. However, the threshold voltage (Vth) becomes shifted with time during the life. If the original gate-source voltage is $V_{GS0}$, gate-source voltage $V_{GS}'$ is obtained as $$V_{GS}' = V_{GS0} + Vth$$

in a certain time period. Therefore, compensation can be made for the amount of this shift if this Vth can be correctly computed and if the transistor can be driven by adding the corresponding voltage. The threshold voltage (Vth) is a voltage indicating the point at which the amount of charge controlled through the gate voltage becomes prevailing over the amount of charge in the semiconductor. As causes of this Vth shift, jumping of electrons into the gate insulating film when electrons flow through the channel and electrification of Si due to cutting of Si bonds caused by electrons flowing through the channel can be mentioned.

The drive transistor 22 is increased in width to enable a large current to flow therethrough, and has a special large-width shape for enabling a current to flow uniformly, e.g., a J-hooked shape (described below) such as to surround an output pin.

For example, in this embodiment, the twig transistor 23 is provided in a portion in such a J-hooked shape. The twig transistor 23 has only the drain formed independently at an end or intermediate position in the J-hooked portion of the drive transistor 22. It is expected that the value of Vth of the drive transistor 22 and the value of Vth of the twig transistor 23 can be made equal to each other. However, there is no need to cause a large current such as that in the drive transistor 22 to flow through the twig transistor 23.

The drive transistor 22 formed of an amorphous silicon TFT becomes charged with time due to jumping of electrons into the film adjacent to the channel when electrons move in the channel, destruction of silicon, etc., as mentioned above, and has its threshold voltage (Vth) thereby shifted during its life. Therefore there is a need to detect the amount of this shift and to drive the TFT by applying corresponding additional voltage. In this embodiment, the twig transistor 23 is used to enable a voltage closer to the drain voltage of the drive transistor 22 to be extracted. That is, while a large current caused to flow through the OLED 21 is flowing through the drive transistor 22, Vth can be extracted from the twig transistor 23 branching from a portion of the drive transistor 22. In this manner, Vth of the large drive transistor 22 provided in the path for the OLED 21 can be measured with accuracy without using a plurality of large transistors.

Since the current flowing through the drive transistor 22 relates to $(Vs-Vth)^2$, a method of monitoring the gate voltage of the drive transistor 22 when the current is sufficiently reduced from the state where the current is caused to flow through the drive transistor 22 is used for detection of Vth. In this embodiment, the concept of novel twig transistor 23 is introduced for this current reducing operation.

The first transistor 24 is turned on at the time of writing of a signal. When the first transistor 24 is turned on, a signal voltage enters the signal capacitor 27. When the first transistor 24 is turned off, data existing at the moment at which the first transistor 24 is turned off is held in the signal capacitor 27.

When the second transistor 25 is off, the signal capacitor 27 and the compensating capacitor 28 are in a state of being disconnected from each other. When the second transistor 25 is turned on, a voltage equal to weighted means of the voltage across the capacitor 27 and the voltage across the capacitor 28 in the preceding state is set across each of the capacitors 27 and 28. Weighting for obtaining the weighted means is determined by the ratio of the capacitances of the two capacitors. For example, if the capacitance ratio of the signal capacitor 27 and the compensating capacitor 28 is 1:2, the voltage after turning on of the second transistor 25 is $$V \text{average} = (1/3)V1 + (2/3)V2$$

where V1 is the signal voltage and V2 is the voltage Vth.

When the third transistor 26 is turned on, charge on the gate of the twig transistor 23 is gradually released through the drain of the twig transistor 23. The twig transistor 23 is thereby turned off. The gate voltage at this time is Vth. Simultaneously, the drive transistor 22 is turned off. If the twig transistor 23 is already in the shut-off state when the third transistor 26 is turned on, detection of Vth is not performed.

The operation of the drive circuit 20 shown in FIG. 2 will now be described.

As a first process, a data write cycle (Vth detection cycle) will first be described. In a state where
first transistor 24 is on,
second transistor 25 is off, and
third transistor 26 is on,
the drain current Id of the twig transistor 23 asymptotically approaches 0 and becomes approximately equal to 0 in about 10 μsec. In the drive transistor 22, Id asymptotically approaches 0 in proportion to Id of the twig transistor 23. At this time, a signal voltage is written to the signal capacitor 27. In the compensating capacitor 28, the voltage Vth of the twig transistor 23 is written and detected.

As a second process, a pause will next be described. When writing of the signal voltage is completed and when the detection of Vth is completed, conditions where
first transistor 24 is off,
second transistor 25 is off, and
third transistor 26 is off,
are set, that is, all the first to third transistors are turned off to fix the voltages. At this time Id=0 in the twig transistor 23; Id=0 in the drive transistor 22; the signal voltage exists in the signal capacitor 27; and the voltage Vth of the twig capacitor 23 exists in the compensating capacitor 28. The second process is inserted between the above-described first process and a below-described third process to prevent racing which is caused when the first and second transistors 24 and 25 or the second and third transistors 25 and 26 are simultaneously turned on.

Finally, in the third process, the second transistor 25 is turned on to add the signal voltage and Vth together. The added voltage is obtained as a gate control voltage for the drive transistor 22. That is,
first transistor 24 is off,
second transistor 25 is on,
third transistor 26 is off,
Id=0 in twig transistor 23, and
Id=Is in drive transistor 22,
At this time, $$(1/3)(\text{signal voltage}) + (2/3)Vth$$

is written to each of the signal capacitor 27 and the compensating capacitor 28.

The operation in an initial state will now be described.

In an initial state, since the voltage across the compensating capacitor 28 is supposed to be 0 V, no current flows through the drive transistor 22. The following is a description of a mechanism for enabling a current to gradually start flowing through the drive transistor 22 from this state.

In the initial state, signal voltage Vs exists in the signal capacitor 27 and the voltage Vc across the compensating capacitor 28 is 0 V. By a first write, a voltage shown by $$V = (1/3)VS + (2/3)VC = (1/3)VS$$

is written to the compensating capacitor 28. If this voltage is higher than Vth, the signal voltage and Vth are combined at the time of the second write and after the second write.

In a transient state, by the second or nth voltage write, a voltage shown by $$Vc = Vs(1 - (2/3)^n)$$

is given to the compensating capacitor 28. In this way the voltage Vc of the compensating capacitor 28 gradually approaches Vs. By writing repeatedly a certain number of times, the drive transistor 22 becomes conductive. Once the drive transistor 22 becomes conductive, Vth compensation is thereafter made.

Finally, in a steady state, signal voltage Vs is applied to the signal capacitor 27 and voltage Vth is set across the compensating capacitor 28. When the second transistor 25 is turned on, a voltage corresponding to the sum of weighted Vth and signal voltage Vs as shown by $$Vc = (1/3)Vs + (2/3)Vth$$

remains in the compensating capacitor 28 to be used as a voltage for control of the drive transistor 22 which is a large transistor for driving the OLED 21.

A soft start of the drive transistor 22 is made as described above to avoid causing an excessive load on the drive transistor 22. If the drive transistor 22 is turned completely on before detection of Vth, measurement of Vth can be performed from the first write. However, a surge current may be thereby caused to impose an excessive load on the OLED 21 and the drive transistor 22. Moreover, since the OLED 21 lights when the surface current flows, the range of gradation from a dark portion relating to image quality is limited to about 1000 times the lowest level. There is a possibility that this deterioration in gradation will be considered a problem in future. The above-described method makes it possible to cope with such a problem.

A drive circuit using a J-hook type of parasitic transistor will next be described.

FIGS. 3A to 3D are diagrams showing J-hook transistors in several patterns. In this embodiment, a transistor D1 for causing a large current and a twig transistor D2 for detecting Vth can be formed by using one of these J-hook transistors. As shown in FIGS. 3A to 3D, each J-hook transistor is increased in width to enable a large current to flow therethrough, and has a special J-hooked shape such as to surround an output pin, which shape is selected to enable a current to flow uniformly. In this embodiment, a source electrode and a gate electrode in the J-hook transistor are formed as common electrodes for transistors D1 and D2, and the transistor D2 is formed by forming a portion of the drain electrode of the transistor D1 as an independent portion. In the J-hook transistor shown in FIG. 3(a), the twig transistor D2 is formed at an end of the transistor D1. In the J-hook transistor shown in FIG. 3B, a twig transistor D2 is formed at an intermediate position in a transistor D1, and a transistor D1 is thereby separated from the transistor D1. In the J-hook transistor shown in FIG. 3C, two twig transistors D2 and D2' are formed at intermediate positions in a transistor D1 and transistors D1' and D" are separately formed. In the J-hook transistor shown in FIG. 3D), three twig transistors D2, D2', and D2" are formed at intermediate positions in a transistor D1, and transistors D1', D", and D1''' are separately formed. If Vth is measured through a plurality of twig transistors D2 between transistors D1, it can be obtained with improved accuracy. However, there is a need to connect the separated portions. By considering wiring necessary for this connection, it can be said that the structure shown in FIG. 3A, in which no separated portions of the transistors D1 and D2 exist, is most preferable. A special configuration in which these amorphous silicon TFTs for driving are formed is devised to enable limitation of local degradation caused by current concentration at some portion. A twig transistor may be formed in a circular type of transistor other than the above-described J-hook transistor.

Figure 4:
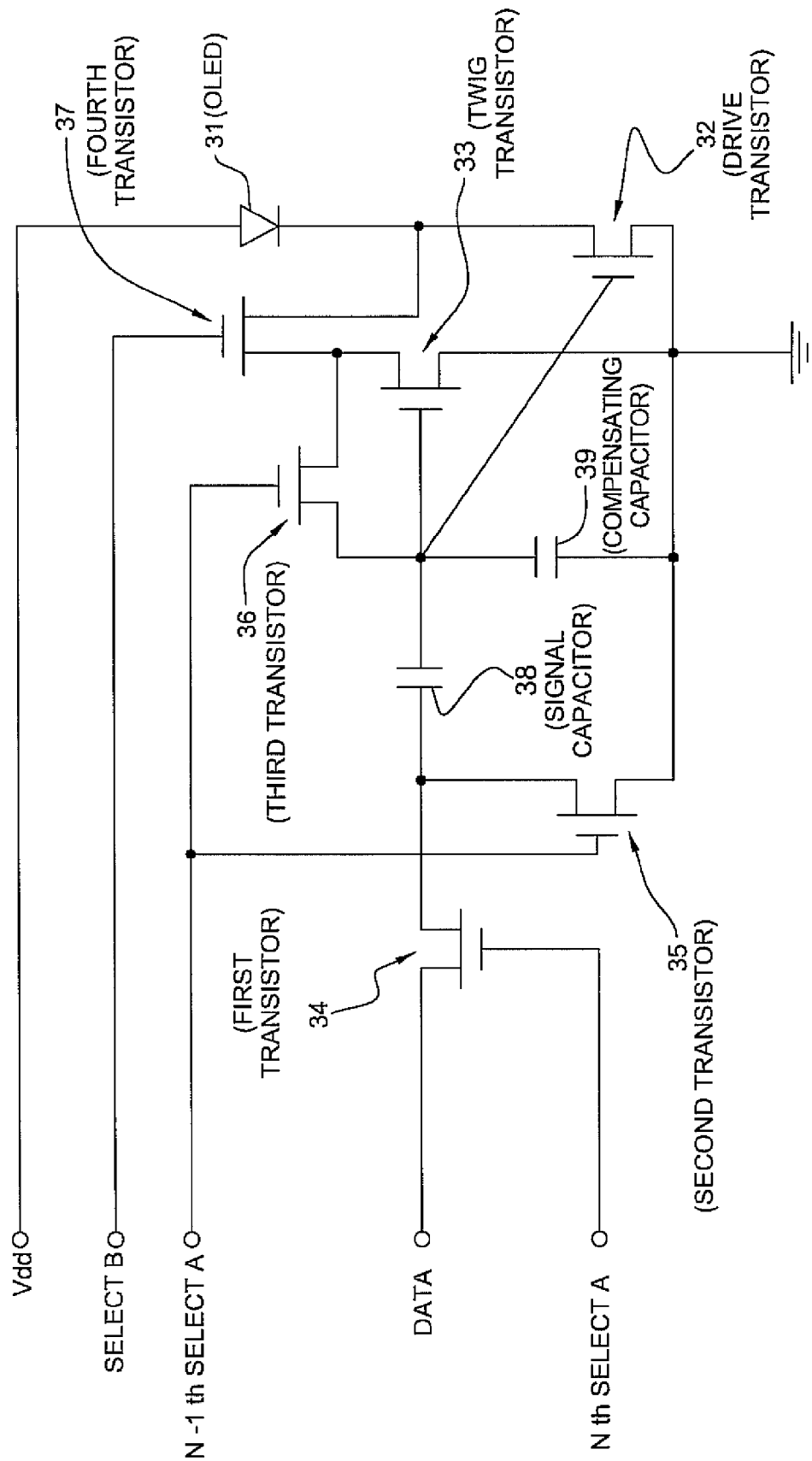
FIG. 4 is a diagram showing a drive circuit in which Vth compensation is made by using a J-hook parasitic transistor.

FIG. 4 is a diagram showing a drive circuit for making Vth compensation by using a J-hook parasitic transistor such as one of those shown in FIGS. 3A to 3D. This drive circuit is constituted by an OLED 31, six transistors (32 to 37), and two capacitors (38, 39). The transistors in the drive circuit are a drive transistor 32 which is provided as a large transistor for driving the OLED 31, and which corresponds to one of the hook-type transistors D1 (D1'/D1"/D1''') shown in FIGS. 3A to 3D, a twig transistor 33 which has a source electrode, a gate electrode, etc. (including amorphous silicon or the like) in common with the drive transistor 32, which has only a drain electrode as its independent portion, and which corresponds to one of the transistors D2 (D2'/D2") shown in FIGS. 3A to 3D, a first transistor 34 provided between a data line and a signal capacitor 38, a second transistor 35 provided between the signal capacitor 38 and a compensating capacitor 39, a third transistor 36 provided between the gate and the drain of the twig transistor 33, and a fourth transistor 37 for causing a current to flow through the twig transistor 33. The capacitors in the drive circuit are the signal capacitor 38 in which a control voltage necessary for control of the drive transistor 32 is written, and the compensating capacitor 39 in which a threshold voltage (Vth), i.e., a point at which a current starts flowing through the drive transistor 32 is stored.

A "Not Select" signal for controlling the fourth transistor 37 is used to disconnect the drive transistor 32 and the twig transistor 33 from each other. When an (N−1)th select signal (N−1th Select) is on, Vth of the twig transistor 33 is detected. A data (Data) signal is a voltage to be written. An Nth select (Nth Select) signal is used to turn on the line for writing. (N−1)th select signal is a signal formed for read of Vth before the Nth write by which data is actually written.

FIG. 5 is a timing chart of drive of the drive circuit shown in FIG. 4. The operation of the drive circuits will be described with respect to periods (1) to (3) shown in FIG. 5. First, in the period (1), the second transistor 35 and the third transistor 36 are turned on by (N−1)th select A signal to start accumulating charge in the signal capacitor 38 and the compensating capacitor 39 at voltage Vth of the drive transistor 32 and the twig transistor 33. Since it is necessary that the gate potential of the drive transistor 32 and the twig transistor 33 be higher than Vth at the start of accumulation, the fourth transistor 37 is turned on by the select B signal to maintain a potential higher than Vth.

In the period (2), the fourth transistor 37 is turned off and the charge accumulated in the signal capacitor 38 and the compensating capacitor 39 flows to ground potential via the third transistor 36 and the twig transistor 33. This condition is maintained until the gate-source voltage Vgs of the twig transistor 33 becomes equal to Vth.

In the period (3), the Nth (write line) select A signal becomes high, the second transistor 35 and the third transistor 36 are turned off, and the first transistor 34 is thereby turned on to write data voltage Vdata from the data line. At this time, the potential across the compensating capacitor 39 is determined by capacitive division, as shown by the following equation.

$$V_{C2} = Vth + \frac{C1}{C1 + C2 + Cg} \cdot Vdata = Vth + \beta \cdot Vdata = Vgs \quad \text{(Equation 4)}$$

Accordingly, the current flowing through the drive transistor 32 becomes equal to the value independent of Vth, as shown by the following equation.

$$Ids = \alpha(Vgs - Vth)^2 = \alpha(\beta Vdata)^2 \quad \text{(Equation 5)}$$

Figure 6A:
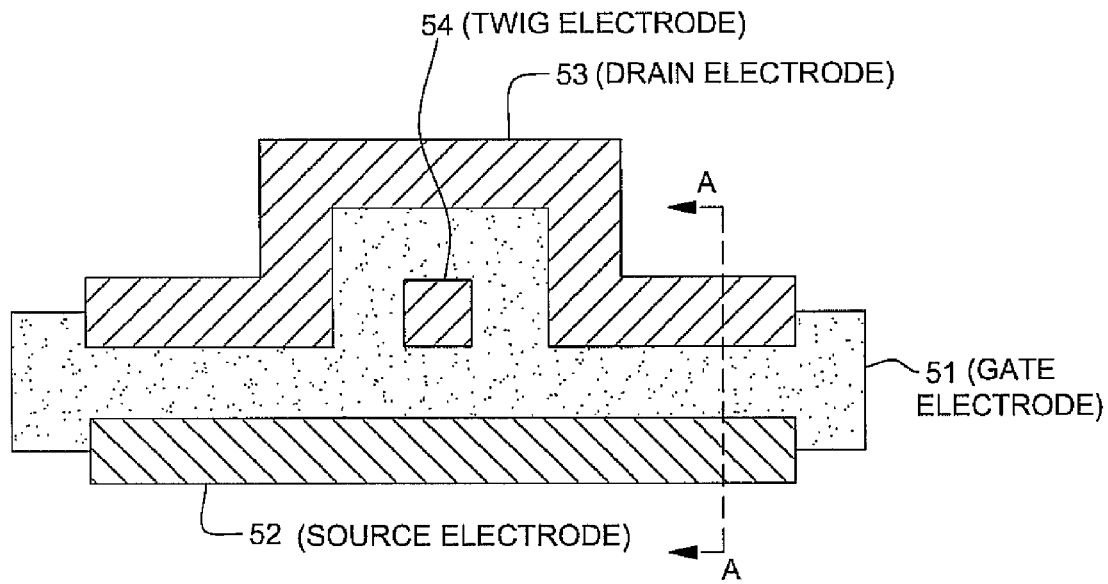
FIGS. 6A and 6B are diagrams showing an example of a configuration for extracting Vth from an amorphous silicon TFT.
Figure 6B:
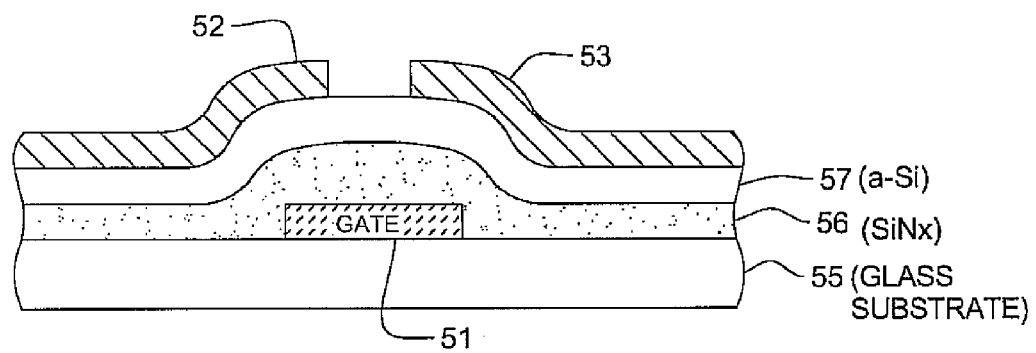

FIGS. 6A and 6B are diagrams showing a configuration for extracting Vth from an amorphous silicon TFT. FIG. 6A is a top view and FIG. 6B is a cross-sectional view taken along a line A-A in FIG. 6A. Referring first to FIG. 6B, in the structure of the inverse staggered amorphous silicon TFT, a gate electrode 51 is formed on a glass substrate 55, and an insulating film 56 of SiNx or the like is formed on the gate electrode 51 and the substrate 55. A layer of amorphous silicon (a-Si) 57 is formed on the insulating film 56, and a source electrode 52 and a drain electrode 53 are formed on the amorphous silicon layer 57. A feature of this embodiment resides in that, as shown in FIG. 6A, a twig electrode 54 which is a fourth electrode subordinate to the drain electrode 53 is provided in the vicinity of the drain electrode 53. That is, in a situation where both the gate electrode 51 and the source electrode 52 are used, the drive transistor 22 or 32 shown in FIG. 2 or 4 is constituted by this drain electrode 53, while the twig transistor 23 or 33 is constituted by the twig electrode 54.

It is preferred that the twig electrode 54 be provided in the vicinity of the drain electrode 53, the twig electrode 54 be surrounded by the drain electrode 53 as completely as possible, and the voltage on the twig electrode 54 be closer to the voltage on the drain electrode 53. The voltage applied to the amorphous silicon (a-Si) 57 changes gradually, and the influence of the voltage propagates through an increasing distance. Therefore, if a structure in which the twig electrode 54 is surrounded by the drain electrode 53 is adopted, the influence of the drain electrode 53 on the twig electrode 54 can be increased to bring the voltage obtained through the twig electrode 54 closer to the voltage on the drain electrode 53.

Figure 7A:
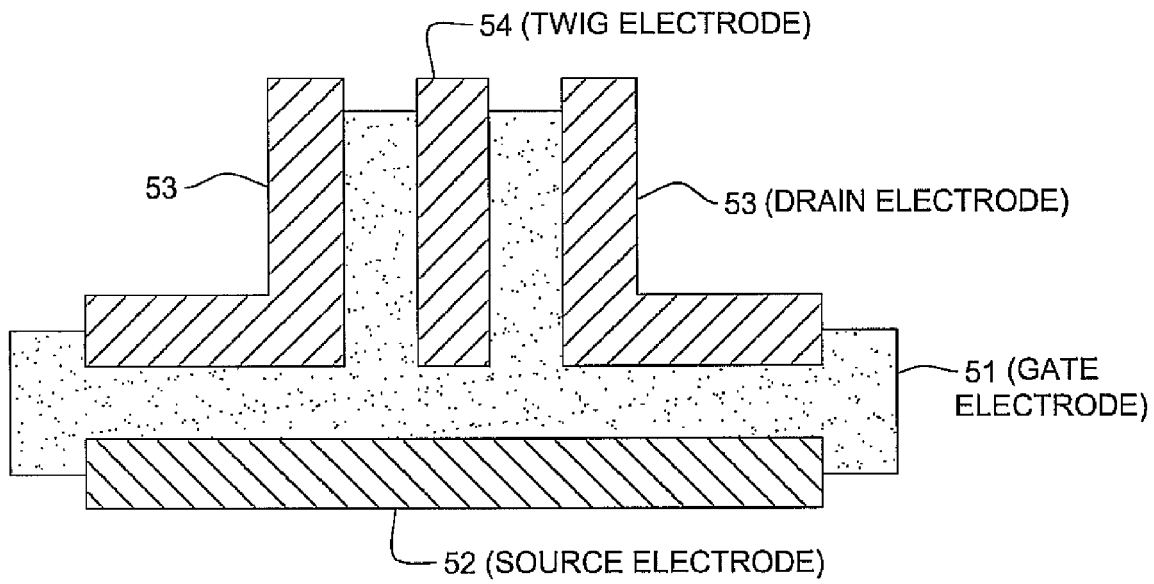
FIGS. 7A and 7B are diagrams showing other configurations of amorphous silicon TFTs.
Figure 7B:
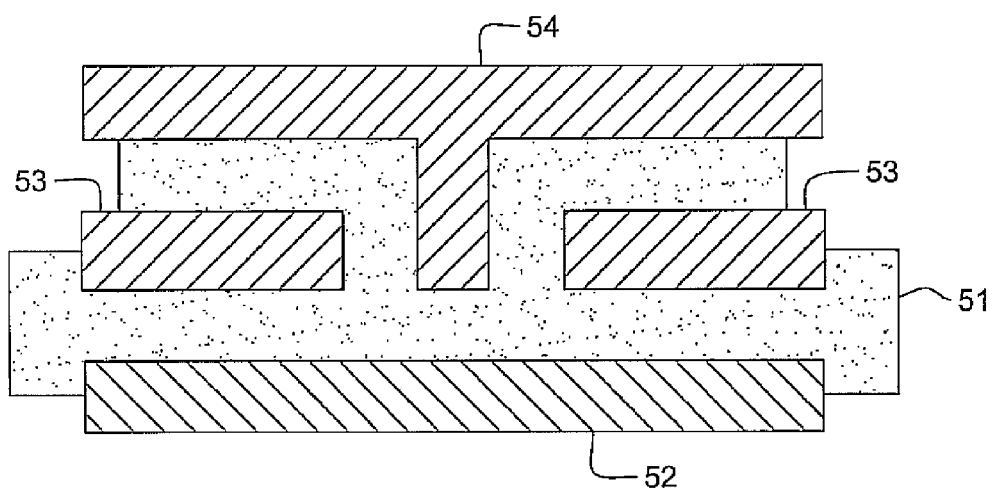
Figure 8A:
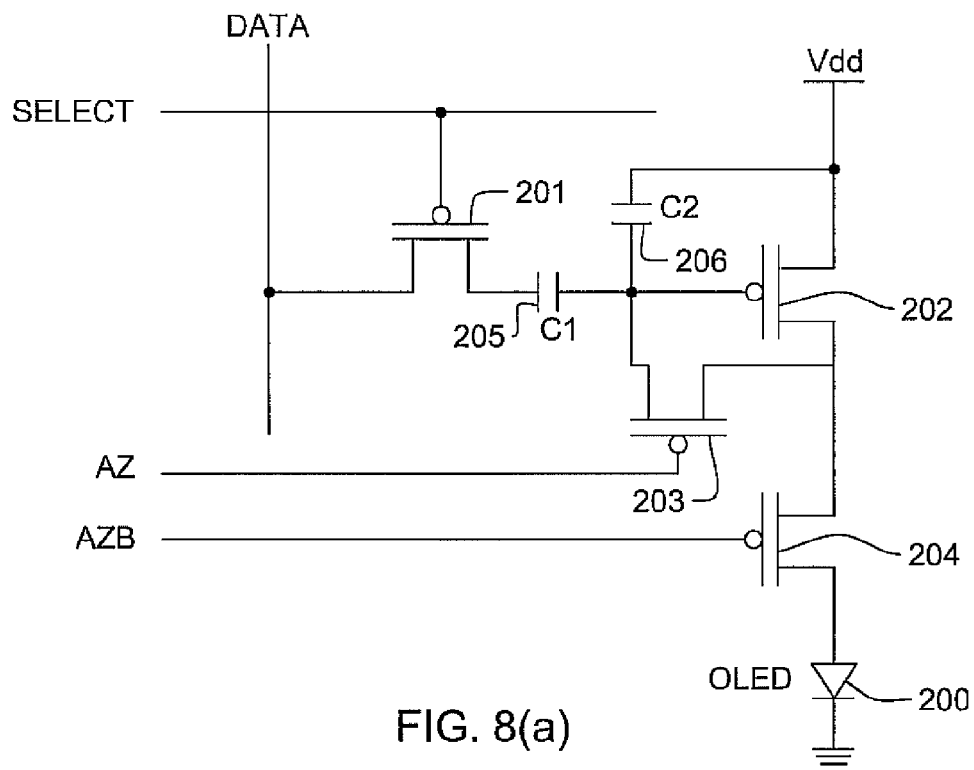
FIG. 8 is a diagram for explaining a method of realizing Vth compensation in a conventional voltage-write system.
Figure 8B:
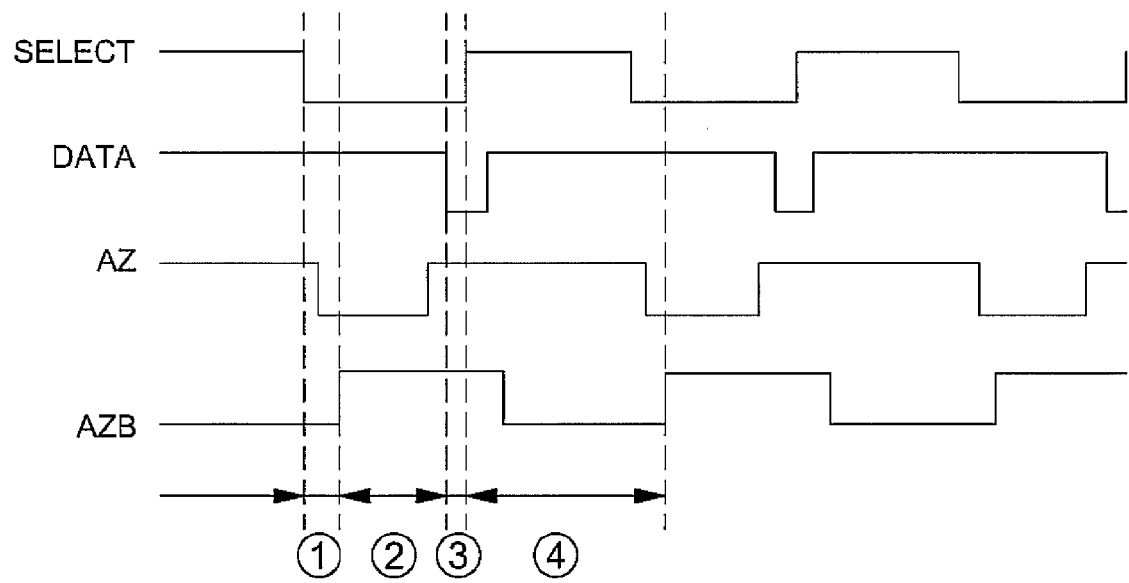
Figure 9A:
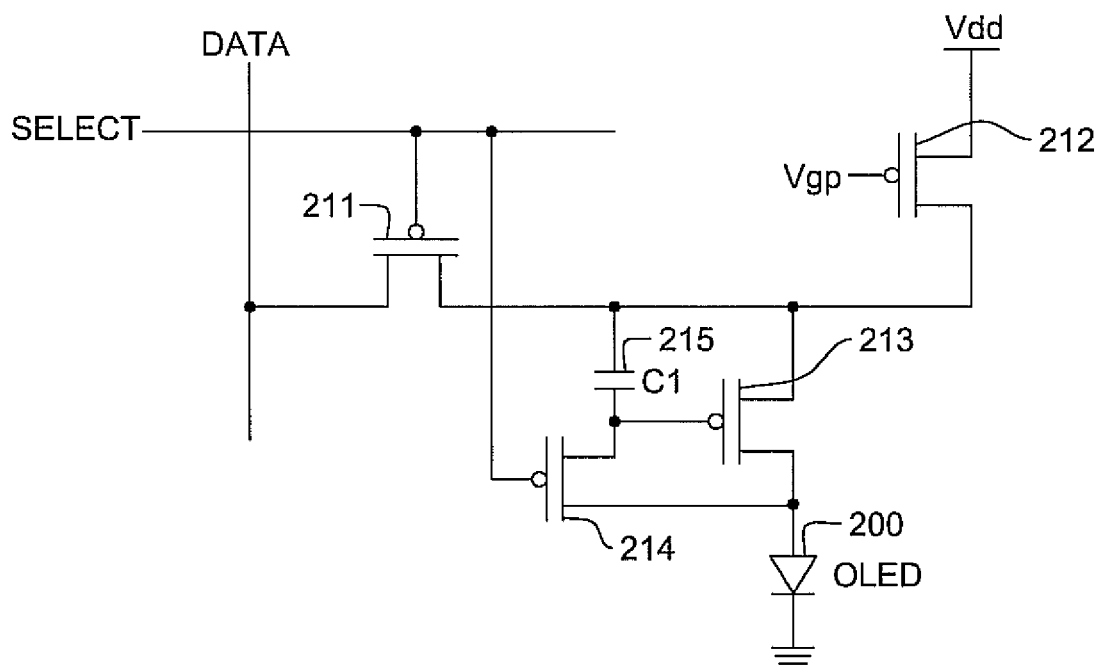
FIG. 9 is a diagram for explaining a method of realizing Vth compensation in a conventional current-write system.
Figure 9B:
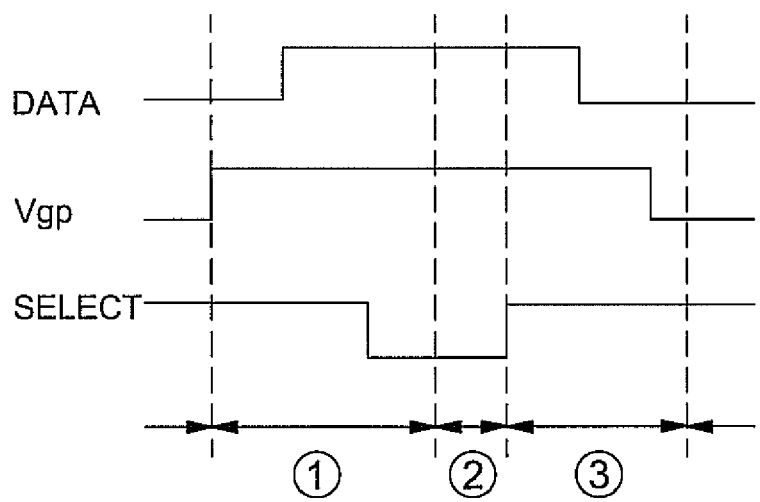

FIGS. 7A and 7B are diagrams showing other configurations of amorphous silicon TFTs. In the configuration shown in FIG. 7A, a twig electrode 54 is placed between two L-shaped drain electrodes 53. In the configuration shown in FIG. 7B, a T-shaped twig electrode 54 is placed so that its portion is interposed between two drain electrodes 53. If drain electrode 53 and twig electrode 54 are formed in such devised shapes that they are placed closer to each other and extend adjacent to each other through an area of a maximized length in an available space, a voltage close to the voltage on the drain electrode 53 can be obtained through the twig electrode 54, thus largely improving the accuracy of measurement of Vth in the amorphous silicon TFT.

In this embodiment, as described above, the drive transistor 22 or 32 formed of an amorphous silicon TFT through which a large current for driving the OLED 21 or 31 is caused to flow is constructed so as to enable its threshold voltage (Vth) to be measured through the twig transistor 23 or 33 having the gate electrode 51, the source electrode 52, etc. in common with the drive transistor 22 or 32 and having the twig electrode 54. That is, this twig transistor 23 or 33 is used in the method of monitoring the gate voltage of the drive transistor 22 or 32 when the current is sufficiently reduced from the state where the current is caused to flow through the drive transistor 22 or 32, thus facilitating detection of Vth and improving the accuracy of detection of Vth.

A method of detecting Vth, for example, based on a method of connecting two transistors in series and using one of them for on/off control and the other for current control is conceivable. However, there is a problem with this method in that since the transistors are connected in series, the area occupied by the transistors is increased and it is difficult to mount the transistors if a device such as an amorphous silicon TFT of a low electron mobility is used to carry out the method. Such a problem relating to mounting can be solved by using the twig transistor 23 or 33. That is, in a transistor structure in one amorphous silicon TFT, a TFT structure having both a portion for detecting Vth and a portion for causing a current is made, thus eliminating the need for providing a plurality of large TFTs.

In this embodiment, a switched capacitor system is used to combine a detected Vth and a signal voltage. This system enables measurement of Vth and write of a signal to be performed in parallel with each other (simultaneously performs detection of Vth and write of data). That is, the obtained Vth is stored in a capacitor and the signal voltage is added to it. In this manner, simplified control and a reduction in the number of control lines can be achieved. Also, it is possible to provide a drive circuit having a shorter write time and improved current stability.

In this embodiment, the twig electrode 54 is formed in such a manner that the gate electrode 51 and the source electrode 52 are formed as common electrodes and a branch from the drain electrode 53 is formed. However, the arrangement may alternatively be such that the gate electrode 51 and the drain electrode 53 are formed as common electrodes while the source electrode 52 branches off.

According to the present invention, as described above, a threshold voltage (Vth) can be suitably extracted from an amorphous silicon TFT.

The invention claimed is:

1. A display unit comprising:
   an organic light emitting diode (OLED) provided in correspondence with each of pixels and capable of emitting light by itself;
   a drive transistor for driving each said OLED; and
   a twig transistor formed so as to have a portion of a drain electrode independently formed within said drive transistor, said drain electrode portion placed in the vicinity of a drain electrode of said drive transistor so as to be exposed to a same voltage condition as said drive transistor, wherein said twig transistor shares a gate electrode and a source electrode with said drive transistor, said twig transistor being used to detect a threshold voltage (Vth) of said drive transistor.

2. The display unit according to claim 1, further comprising a capacitor for storing the threshold voltage (Vth) obtained by said twig transistor,
   wherein a control voltage prepared by correcting a supplied signal voltage on the basis of the threshold voltage (Vth) stored in the capacitor is supplied to said drive transistor.

3. The display unit according to claim 2, further comprising:
   a hold circuit for supplying the signal voltage to said OLED; and
   a scanning circuit for supplying a select signal for scanning to said OLED,
   wherein timing of taking in of the threshold voltage (Vth) and write to said drive transistor is controlled on the basis of the select signal supplied from said scanning circuit.

4. The display unit according to claim 1, wherein said drive transistor is an amorphous silicon TFT, and said twig transistor is formed so as to have a portion of a drain electrode or a source electrode of said amorphous silicon TFT formed as an independent portion.

5. A display unit comprising:
   drive means for driving, by using an amorphous silicon TFT, an organic light emitting diode (OLED) provided in correspondence with each of pixels and capable of emitting light by itself;
   threshold voltage acquisition means for obtaining a threshold voltage (Vth) in said amorphous silicon TFT by using a twig drain electrode of a twig TFT, said twig drain electrode independently formed in said amorphous silicon TFT used by said drive means, a portion of said twig drain electrode placed in the vicinity of a drain electrode of said amorphous silicon TFT so as to be exposed to a same voltage condition, wherein said twig TFT shares a gate electrode and a source electrode with said amorphous silicon TFT; and
   signal voltage supply means for supplying a control voltage to said amorphous silicon TFT on the basis of the threshold voltage (Vth) obtained by said threshold voltage acquisition means.

6. The display unit according to claim 5, wherein said threshold voltage acquisition means obtains, by using said twig drain electrode, a gate voltage when the current flowing through said amorphous silicon TFT is sufficiently reduced from the state where the current is caused to flow through said amorphous silicon TFT.

7. The display unit according to claim 5, wherein said signal voltage supply means prepares the control voltage by adding a newly obtained signal voltage and the threshold voltage (Vth) together.

8. A drive circuit comprising:
   a drive transistor for driving a device to be driven; and a twig transistor formed so as to have a portion of a drain electrode independently formed within said drive transistor, said twig transistor drain electrode portion placed in the vicinity of a drain electrode of said drive transistor so as to be exposed to a same voltage condition as said drive transistor, wherein said twig TFT shares a gate electrode and a source electrode with said drive transistor, said twig transistor detecting a threshold voltage (Vth) of said drive transistor when a current flows through said drive transistor.

9. The drive circuit according to claim 8, further comprising:
   a compensating capacitor in which the threshold voltage (Vth) detected by said twig transistor is written; and
   a signal capacitor in which a signal voltage necessary for control of said drive transistor is written.

10. The drive circuit according to claim 9, further comprising:
    a first transistor provided between a data line and said signal capacitor;
    a second transistor provided between said signal capacitor and said compensating capacitor; and
    a third transistor provided between a gate electrode and another electrode of said twig transistor.

11. The drive circuit according to claim 8, wherein said drive transistor is an amorphous silicon TFT through which a current for driving an organic light emitting diode (OLED) is caused to flow, and said twig transistor changes by following a change in voltage of said drive transistor to enable detection of the threshold voltage (Vth).

12. An amorphous silicon thin-film transistor comprising:
    a gate electrode;
    amorphous silicon;
    a source electrode and a drain electrode which face said gate electrode with said amorphous silicon interposed therebetween; and
    a twig electrode of a twig transistor, said twig electrode independently formed at an end position or intermediate position within and separated from a portion of one of said source electrode and said drain electrode of said amorphous silicon thin-film transistor,
    wherein said twig electrode is placed in a position in the vicinity of a formed drain electrode portion of said drive transistor so as to be exposed to a same voltage condition as said drive transistor, wherein said twig transistor shares a gate electrode and a source electrode with said drive transistor.

13. The amorphous silicon thin-film transistor according to claim 12, wherein said one of said source and drain electrode is physically separated into a first electrode portion and a separated electrode portion, wherein said twig electrode is placed within said physical separation.

14. The amorphous silicon thin-film transistor according to claim 12, wherein said one of said source and drain electrode is physically separated into a first electrode portion and a separated electrode portion, wherein said twig electrode is placed within said physical separation, said twig electrode for detecting a threshold voltage (Vth) of a transistor formed by the first electrode portion.

15. An amorphous silicon thin-film transistor comprising:
    a gate electrode;
    amorphous silicon;
    a source electrode and a drain electrode which face said gate electrode with said amorphous silicon interposed therebetween; and
    a twig electrode formed as a branch from said drain electrode and forming a twig transistor for detecting a threshold voltage (Vth) of a amorphous silicon thin-film drive transistor formed by said gate electrode, said source electrode and said drain electrode, said twig electrode placed in the vicinity of said drain electrode of said drive transistor so as to be exposed to a same voltage condition as said drive transistor, wherein said twig transistor shares a gate electrode and a source electrode with said drive transistor.

16. The amorphous silicon thin-film transistor according to claim 15, wherein said amorphous silicon thin-drive transistor formed by said drain electrode is used as a drive transistor for driving an organic light emitting diode (OLED), and said transistor formed by said twig electrode functions as a twig transistor which changes by following a change in voltage of said drive transistor.

17. A method of driving an organic light emitting diode (OLED) by an amorphous silicon TFT, comprising the steps of:
    writing a signal voltage to the amorphous silicon TFT;
    reading a threshold voltage (Vth) of the amorphous silicon TFT by using a twig electrode of a twig transistor, said twig electrode independently provided on the amorphous silicon TFT, a portion of said twig electrode placed in the vicinity of an electrode of said amorphous silicon TFT so as to be exposed to a same voltage condition wherein said twig TFT shares a gate electrode and a source electrode with said amorphous silicon TFT; and
    supplying a control voltage to the amorphous silicon TFT by correcting a new signal voltage on the basis of the threshold voltage (Vth).

18. The method according to claim 17, wherein said step of supplying the control voltage comprises adding the new signal voltage and the threshold voltage (Vth) together.

19. The method according to claim 17, wherein said step of reading the threshold voltage (Vth) comprises executing reading on the basis of an (N−1)th select signal precedent to an Nth select signal for supplying the control voltage.

* * * * *